(12) United States Patent
Tien et al.

(10) Patent No.: US 12,393,762 B2
(45) Date of Patent: *Aug. 19, 2025

(54) METHOD FOR GENERATING A LAYOUT DIAGRAM OF A SEMICONDUCTOR DEVICE INCLUDING POWER-GRID- ADAPTED ROUTE-SPACING

(71) Applicant: TAIWAN SEMICONDUCTOR MANUFACTURING COMPANY, LTD., Hsinchu (TW)

(72) Inventors: Li-Chun Tien, Hsinchu (TW); Shun Li Chen, Hsinchu (TW); Ting-Wei Chiang, Hsinchu (TW); Ting Yu Chen, Hsinchu (TW); XinYong Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 762 days.

This patent is subject to a terminal disclaimer.

(21) Appl. No.: 17/525,375

(22) Filed: Nov. 12, 2021

(65) Prior Publication Data

US 2022/0075923 A1    Mar. 10, 2022

Related U.S. Application Data

(62) Division of application No. 16/373,356, filed on Apr. 2, 2019, now Pat. No. 11,182,529.

(51) Int. Cl.
*H01L 23/52* (2006.01)
*G06F 30/30* (2020.01)
(Continued)

(52) U.S. Cl.
CPC ............ *G06F 30/394* (2020.01); *G06F 30/30* (2020.01); *G06F 30/392* (2020.01); *H01L 23/5226* (2013.01); *H01L 23/5286* (2013.01)

(58) Field of Classification Search
CPC ............ H01L 23/5226; H01L 23/5286; G06F 30/394; G06F 30/392
See application file for complete search history.

(56) References Cited

U.S. PATENT DOCUMENTS 7,260,442 B2    8/2007    Hwang et al.
9,256,709 B2    2/2016    Yu et al.
(Continued)

FOREIGN PATENT DOCUMENTS

| CN | 101656253 A | 2/2010 |
|---|---|---|
| CN | 102282667 | 12/2011 |
| TW | 201723902 | 7/2017 |

OTHER PUBLICATIONS

Office Action dated Mar. 3, 2021 for corresponding case No. CN 201810284453.X (pp. 1-9).

*Primary Examiner* — Fernando L Toledo
*Assistant Examiner* — Valerie N Newton
(74) *Attorney, Agent, or Firm* — Hauptman Ham, LLP

(57) ABSTRACT

A method of generating a layout diagram of a semiconductor device includes populating a conductive layer M(h) with segment patterns representing corresponding conductive segments in the semiconductor device. The segment patterns including first and second power grid (PG) patterns and first routing patterns, where h is an integer and h≥1. Arranging long axes of the first and second PG patterns and the first routing patterns to extend in a first direction. Arranging the first and second PG patterns to be separated, relative to a second direction, by a PG gap having a midpoint. The second direction being substantially perpendicular to the first direction. Distributing the first routing patterns between the first and second PG patterns and substantially uniformly in the second direction with respect to the midpoint of the PG gap.

20 Claims, 8 Drawing Sheets

(51) Int. Cl.
  *G06F 30/392* (2020.01)
  *G06F 30/394* (2020.01)
  *H01L 23/522* (2006.01)
  *H01L 23/528* (2006.01)

(56) References Cited

U.S. PATENT DOCUMENTS

| | | |
|---|---|---|
| 9,887,210 B2 | 2/2018 | Song et al. |
| 11,182,529 B2 * | 11/2021 | Tien ................. G06F 30/30 |
| 2010/0044755 A1 | 2/2010 | Tsuda et al. |
| 2014/0040838 A1 | 2/2014 | Liu et al. |
| 2015/0084097 A1 | 3/2015 | Jeon et al. |
| 2015/0278429 A1 | 10/2015 | Chang |
| 2015/0371959 A1 | 12/2015 | Frederick, Jr. et al. |
| 2019/0123140 A1 * | 4/2019 | Park ................ H01L 21/823437 |

* cited by examiner

METHOD FOR GENERATING A LAYOUT DIAGRAM OF A SEMICONDUCTOR DEVICE INCLUDING POWER-GRID- ADAPTED ROUTE-SPACING

PRIORITY CLAIM AND CROSS-REFERENCE

This application is a divisional application of U.S. patent application Ser. No. 16/373,356 filed Apr. 2, 2019, now U.S. Pat. No. 11,182,529, issued Nov. 23, 2021, which is incorporated herein by reference in its entirety.

BACKGROUND

An integrated circuit ("IC") includes one or more semiconductor devices. One way in which to represent a semiconductor device is with a plan view diagram referred to as a layout diagram. A layout diagram is hierarchical and is decomposed into modules which carry out higher-level functions as required by the IC's design specifications. In some circumstances, a semi-custom design (SCD) project decomposes the modules into macro cells, standard cells and custom cells.

For a given SCD project, a custom cell is designed with an arrangement that is specific to the given SCD project in order to provide (in operation) a higher-level logic function that is specific to the SCD project. By contrast, a standard cell is designed with no particular project in mind, and a library of standard cells includes standard cells which provide (in operation) common, lower-level logic functions. In terms of a footprint within a layout diagram, custom cells are larger (typically much larger) than standard cells. Moreover, for a given library, all of the standard cells have at least one dimension which is the same size (typically, the size being a multiple of a library-specific fixed dimension) in order to facilitate placement of the standard cells into a layout diagram. As such, standard cells are described as being predefined with respect to a given SCD project. Custom cells may or may not have at least one dimension that is the same size as the corresponding dimension of the standard cells.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
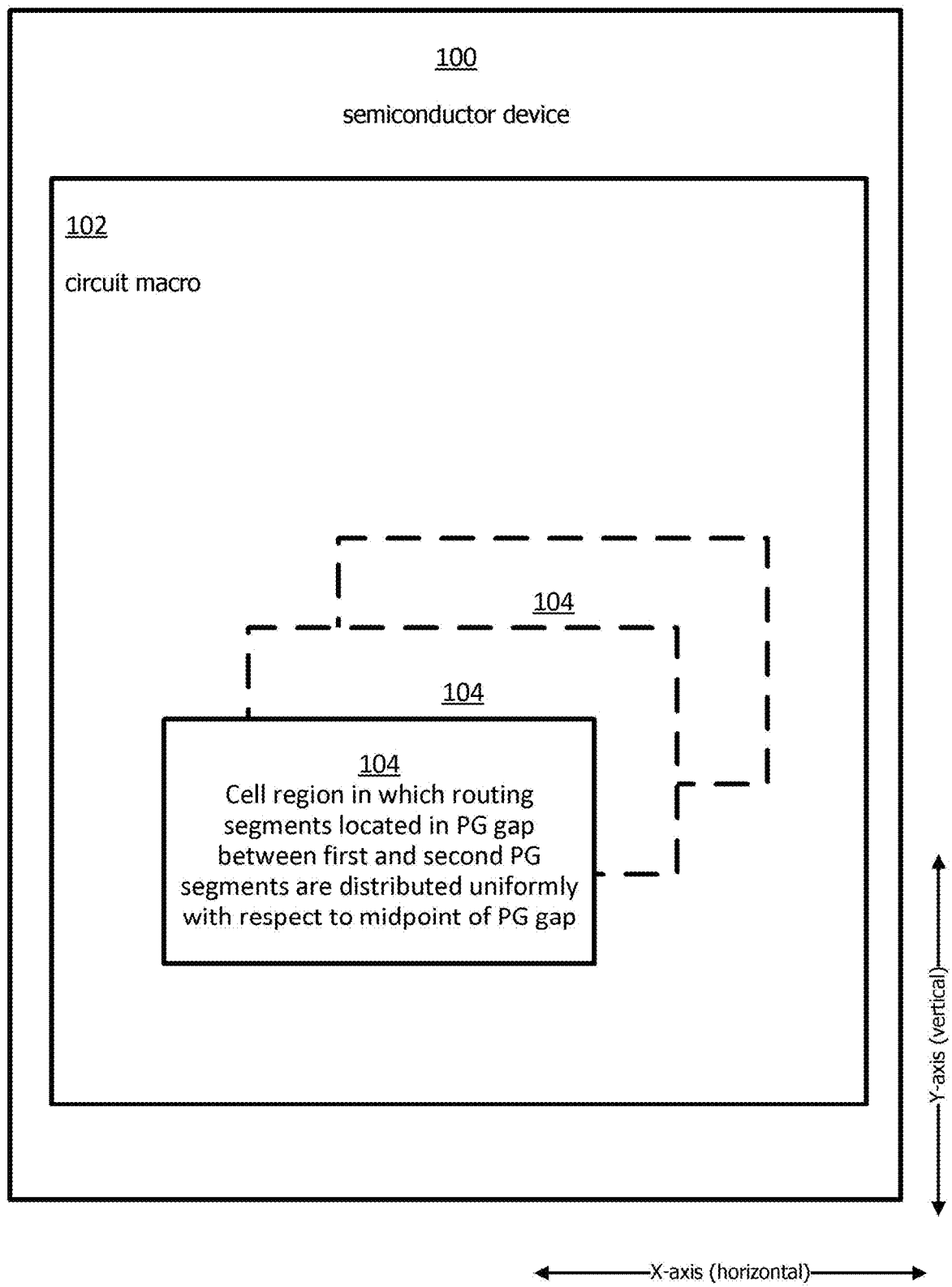
FIG. 1 is a block diagram of a semiconductor device, in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a third layer ($M\_3^{rd}$) of metallization in a semiconductor device includes first and second power grid (PG) segments and first routing segments which are conductive and which have long axes extending in a first direction. The first and second PG segments are separated in a second direction by a PG gap having a midpoint, the second direction being substantially perpendicular to the first direction. The long axes of the first and second PG segments are aligned with corresponding tracks of a first imaginary grid. The long axes of the first routing segments are aligned with corresponding tracks of a second imaginary grid which is adapted to the PG gap. In addition to being distributed between the first and second PG segments, the first routing segments are distributed substantially uniformly in the second direction with respect to the midpoint of the PG gap. In some embodiments, such spacing is referred to as PG-adapted route-spacing. According to another approach, the long axes of the first and second PG segments and the first routing segments in layer $M\_3^{rd}$ are aligned with corresponding tracks of the same imaginary grid.

In some embodiments, a first layer ($M\_1^{st}$) of metallization is a layer which includes gate electrodes, plugs (e.g., MP contacts for gate electrodes, MD contacts for source/drain (S/D) regions, or the like), gate insulators, or the like. In some embodiments, a second layer ($M\_2^{nd}$) of metallization is located between layer $M\_1^{st}$ and layer $M\_3^{rd}$.

Assuming that sizes in the second direction (A) of standard cells and (B) of routing segments in layer $M\_3^{rd}$ included therein (1) according to the other approach and (2) according to at least some embodiments have substantially the same corresponding sizes, and assuming (C) a number of routing segments in layer $M\_3^{rd}$ disposed between two corresponding PG segments (1) according to the other approach and (2) according to at least some embodiments is the same, then the PG-adapted route-spacing of at least some embodiments has an advantage as compared to the other approach. In some embodiments, such an advantage is that the size of the PG segments according to at least some embodiments is greater than the size of the PG segments according to the other approach. In some embodiments, the greater size of the PG segments provides greater current capacity, e.g., without suffering an otherwise corresponding increase in cell size.

In some embodiments, regarding layout diagrams on which are based corresponding semiconductor devices, and more particularly regarding segment patterns including PG patterns and second routing patterns in a second layer ($M\_2^{nd}$) of metallization (representing corresponding $M\_2^{nd}$ segments in a semiconductor device), there are design rules for generating layout diagrams. In some embodiments, a 'feasible-via' design rule constrains a location and size of a segment pattern in the layer $M\_2^{nd}$ with respect to tracks in an imaginary routing grid for the overlying $M\_3^{rd}$ layer.

In some embodiments, according to the feasible-via design rule, each segment pattern in layer $M\_2^{nd}$ is to be: located so as to intersect tracks for the $M\_3^{rd}$ layer at two or more corresponding candidate intersections; and sized so that if a via in a layer $VIA\_2^{nd}$ of interconnection were located at a given candidate intersection, then the via would be at least substantially completely overlapped by the segment pattern in layer $M\_2^{nd}$. The feasible-via is so named because it results in at least two vias, each of which is feasible because it is substantially completely overlapped by the corresponding segment in layer $M\_2^{nd}$.

FIG. 1 is a block diagram of a semiconductor device 100, in accordance with at least one embodiment of the present disclosure.

In FIG. 1, semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, one or more cell regions 104 having PG-adapted route spacing. Examples of layout diagrams which are used to fabricate cell region 104 include the layout diagrams of FIGS. 2A, 2B, 3 and 4, or the like. An example of a cross-section of a portion of semiconductor device which includes cell region 104 is the cross-section of FIG. 5.

Figures 2A, 2B:
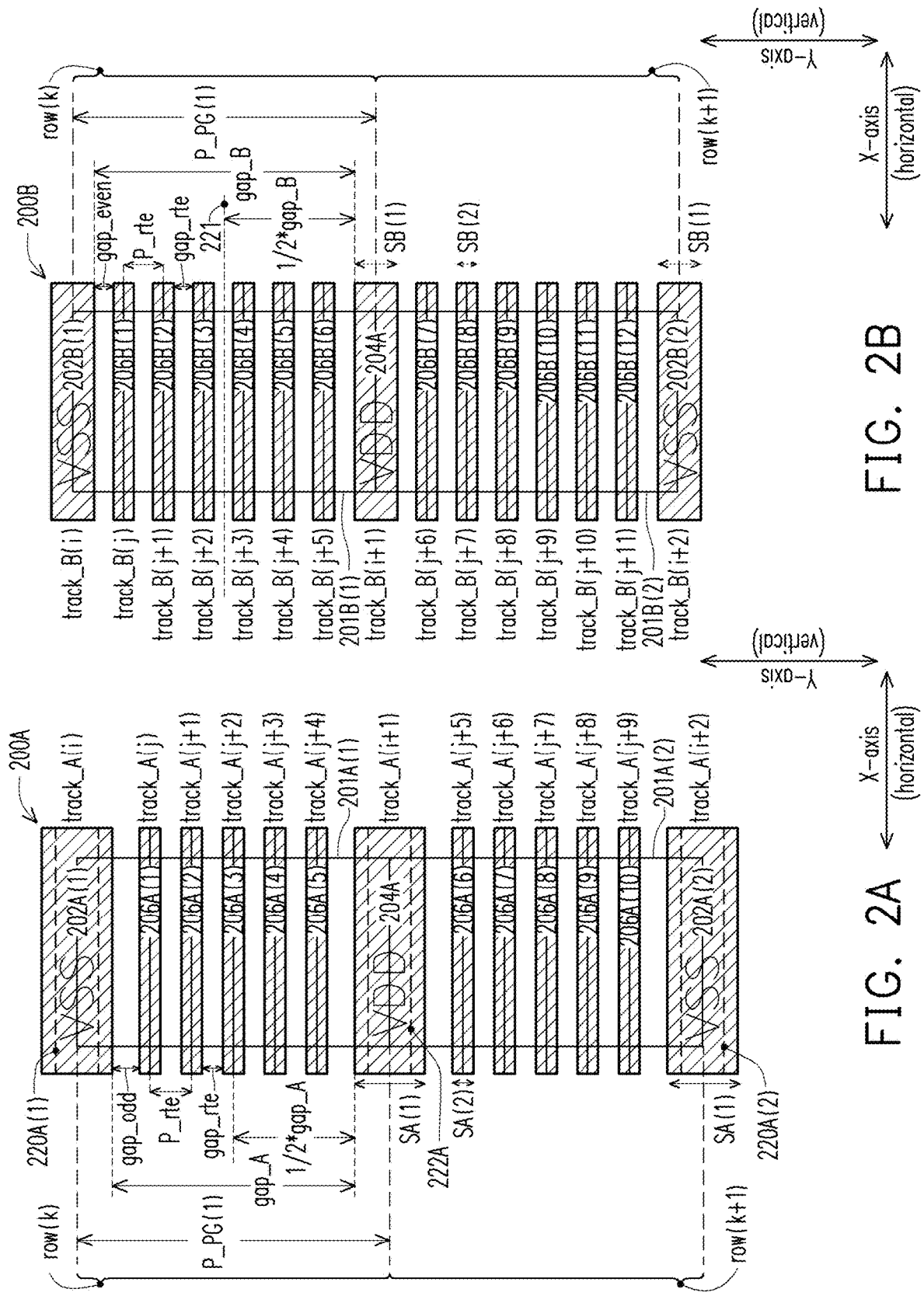
FIG. 2A is a layout diagram, in accordance with at least one embodiment of the present disclosure.
FIG. 2B is a layout diagram, in accordance with at least one embodiment of the present disclosure.

FIG. 2A is a layout diagram 200A, in accordance with at least one embodiment of the present disclosure. An example of a cell region based on layout diagram 200A is cell region 104 included in semiconductor device 100 of FIG. 1.

Layout diagram 200A includes a layer M(h) of metallization, where h is an integer and h≥2. In some embodiments, the $h^{th}$ layer is the third layer, $M\_3^{rd}$, of metallization. If the numbering convention of the corresponding design rules of the corresponding semiconductor process technology node begins with first layer $M\_1^{st}$ being referred to as M(0), then third layer $M\_3^{rd}$ is also referred to as M(2). Alternatively, if the numbering convention begins with first layer $M\_1^{st}$ being referred to as M(1), then third layer $M\_3^{rd}$ is also referred to as M(3). Layer M(h) is arranged, at least in part, with respect to first and second imaginary grids. In some embodiments, a second layer, $M\_2^{nd}$ of metallization is located between layer $M\_1^{st}$ and layer $M\_3^{rd}$.

Layer M(h) includes segment patterns representing corresponding conductive segments of metallization in a semiconductor device. The segment patterns of layer M(h) include: power grid (PG) patterns 202A(1), 202A(2) and 204A; and routing patterns 206A(1)-206A(10).

In layer M(h), long axes of the segment patterns extend in a first direction. In some embodiments, the first direction is the X-axis and is described as being horizontal.

In some embodiments, PG patterns 202A(1), 202A(2) are designated for a first reference voltage, and PG pattern 204A is designated for a second reference voltage. In some embodiments, the first reference voltage is VDD. In some embodiments, the second reference voltage is VSS.

The long axes of PG patterns 202A(1), 202A(2) and 204A are aligned with corresponding tracks of the first imaginary grid, namely track_A(i), track_A(i+1) and track_A(i+2), where i is an integer and i≥0. Layout diagram 200A includes rows, namely row (k) and row (k+1), where k is an integer and i≥0. Track_A(i) and track_A(i+1) represent first and second boundaries of row (k). Track_A(i+1) and track_A (i+2) represent first and second boundaries of row (k+1). Standard cells 201A(1) and 201A(2) are disposed correspondingly in row (k) and row (k+1).

Tracks of the first imaginary grid have a pitch, P_PG(1). In some embodiments, P_PG (1) is an integer multiple of a minimum vertical line size which can be fabricated according to the corresponding semiconductor process technology node. In some embodiments, P_PG (1) is an integer multiple of a minimum vertical pitch for polysilicon features (poly pitch) which can be fabricated according to the corresponding semiconductor process technology node.

Relative to a second direction, each of PG patterns 202A(1), 202A(2) and 204A has a size SA(1), the second direction being substantially perpendicular to the first direction. In some embodiments, the second direction is the Y-axis and is described as being vertical. In some embodiments, size SA(1) is an integer multiple of a minimum vertical line size which can be fabricated according to the corresponding semiconductor process technology node. In some embodiments, PG patterns 202A(1) and 202A(2) have a different vertical size than PG pattern 204A.

PG patterns 220A(1), 220A(2) and 222A of underlying layer $M\_2^{nd}$ are shown using phantom (dashed) lines in FIG. 2A, and are aligned with corresponding track_A(i), track_A (i+1) and track_A(i+2) of the first imaginary grid. Relative to a second direction, each of PG patterns 220A(1), 220A(2) and 222A has a vertical size smaller than SA(1). In some embodiments, each of PG patterns 220A(1), 220A(2) and 222A has the same vertical size. In some embodiments, each of PG patterns 220A(1) and 220A(2) has the same first vertical size and PG pattern 222A has a second vertical size different than the first vertical size. In some embodiments, each of PG patterns 220A(1), 220A(2) and 222A has a vertical size SB(1) (see FIG. 2B, discussed below). In some embodiments, PG patterns 220A(1) and 220A(2) have a different vertical size than PG pattern 222A.

PG patterns 202A(1) and 204A are separated, relative to the second direction, by a distance gap_A. More particularly, gap_A extends from a bottom edge of PG pattern 202A(1) to a top edge of PG pattern 204(A).

Regarding the routing patterns, the long axes of routing patterns 206A(1)-206A (10) are aligned with corresponding tracks of the second imaginary grid, namely track_A(j), track_A(j+1), . . . , track_A(j+8) and track_A(j+9), where j is an integer and j≥0. Tracks of the second imaginary grid have a pitch, P_rte. A midpoint of gap_A represents a point along track_A(j+2).

An odd number of routing patterns, namely 206A(1)-206A(5), are distributed vertically between PG patterns 202A(1) and 204A. In FIG. 2A, the number of routing patterns distributed vertically between PG patterns 202A(1) and 204A is five. In some embodiments, the number of routing patterns distributed vertically between PG patterns 202A(1) and 204A is an odd number other than five.

The distribution of routing patterns 206A(1)-206A(5) is substantially uniform in the vertical direction with respect to a midpoint of gap_A. In some embodiments, such uniform distribution of routing patterns 206A(1)-206A(5) with respect to the midpoint of gap_A(which, again, is the distance between PG patterns 202A(1) and 204A) is referred to as PG-adapted route-spacing.

Each of routing patterns 206A(1)-206A(10) has vertical size SA(2). In some embodiments, SA(2) is an integer multiple of a minimum vertical line size which can be fabricated according to the corresponding semiconductor process technology node. In some embodiments, SA(2) is the minimum vertical line size.

Neighboring ones of routing patterns 206A(1)-206A(5) are separated vertically by a distance gap_rte. For example, routing patterns 206A(1) and 206A(2) are separated by the distance gap_rte. In some embodiments, gap_rte is an integer multiple of the minimum distance between features (minimum feature gap) which can be fabricated according to the corresponding semiconductor process technology node. In some embodiments, gap_rte is the minimum feature gap.

Routing pattern 206A(1) is vertically separated from PG pattern 202A(1) by a distance gap_odd. Routing pattern 206A(5) is vertically separated from PG pattern 204A by the distance gap_odd. In FIG. 2A, gap_odd is larger than gap_rte. In some embodiments, gap_odd is substantially the same as gap_rte.

As noted, according to another approach, the long axes of the first and second PG segments and the first routing segments in layer $M\_3^{rd}$ are aligned with corresponding tracks of the same imaginary grid. Assuming that (1) a vertical size of standard cells according to the other approach are the same size as a vertical size of cells 201A(1) and 201A(2), that (2) a vertical size of routing patterns according to the other approach is the same as SA(2) of routing segments 206A(1)-206A(10), and that (3) there are five routing segments per cell distributed between corresponding PG segments according to the other approach in the same way as there are for cells 201A(1) and 201A(2), then the PG-adapted route-spacing of layout diagram 200A has an advantage as compared to the spacing of routing patterns according to the other approach. In some embodiments, the advantage of the PG-adapted route-spacing of layout diagram 200A is that the size SA(1) of PG segments 202A(1), 202A(2) and 204A is greater than the size of the PG segments according to the other approach. As compared to the other approach, in some embodiments, the greater size of PG segments 202A(1), 202A(2) and 204A provides greater current capacity, e.g., without suffering an otherwise corresponding increase in the vertical size of cells 202A(1) and 202A(2).

FIG. 2B is a layout diagram 200B, in accordance with at least one embodiment of the present disclosure. An example of a cell region based on layout diagram 200B is cell region 104 included semiconductor device 100 of FIG. 1.

Layout diagram 200B of FIG. 2B is similar to layout diagram 200A of FIG. 2B. Corresponding elements are indicated with similar alphanumeric references albeit with alphanumeric references in FIG. 2B including a letter "B" whereas alphanumeric references in FIG. 2A include a letter "A." For example, consider cell 201A(1) in layout diagram 200A of FIG. 2A and corresponding cell 201B(1) in layout diagram 200B of FIG. 2B. For the sake of brevity, the discussion will focus on differences of layout diagram 200B with respect to layout diagram 200A.

Layout diagram 200B includes a layer M(h) of metallization, where h is an integer and h≥2. In some embodiments, the $h^{th}$ layer is the third layer, $M\_3^{rd}$, of metallization. In some embodiments, a second layer, $M\_2^{nd}$, of metallization is located between layer $M\_1^{st}$ and layer $M\_3^{rd}$.

Layer M(h) includes segment patterns representing corresponding conductive segments of metallization in a semiconductor device. The segment patterns of layer M(h) include: power grid (PG) patterns 202B(1), 202B(2) and 204B; and routing patterns 206B(1)-206B(12).

The long axes of PG patterns 202B(1), 202B(2) and 204B are aligned with corresponding tracks of the first imaginary grid, namely track_B(i), track_B(i+1) and track_B(i+2), where i is an integer and i≥0. Standard cells 201B(1) and 201B(2) are disposed correspondingly in row (k) and row (k+1).

Tracks of the first imaginary grid have the pitch, P_PG (1). In some embodiments, P_PG (1) is an integer multiple of a minimum vertical line size which can be fabricated according to the corresponding semiconductor process technology node. In some embodiments, P_PG (1) is an integer multiple of a minimum vertical pitch for polysilicon features (poly pitch) which can be fabricated according to the corresponding semiconductor process technology node.

Relative to a second direction, each of PG patterns 202B(1), 202B(2) and 204B has a size SB(1). In some embodiments, size SB(1) is an integer multiple of a minimum vertical line size which can be fabricated according to the corresponding semiconductor process technology node. In some embodiments, PG patterns 202B(1) and 202B(2) have a different vertical size than PG pattern 204B. Size SB(1) of FIG. 2B is less than size SA(1) of FIG. 2. In some embodiments, PG patterns 220B(1) and 220B(2) have a different vertical size than PG pattern 222B.

PG patterns 202B(1) and 204B are separated, relative to the second direction, by a distance gap_B. More particularly, gap_B extends from a bottom edge of PG pattern 202B(1) to a top edge of PG pattern 204(B). The distance gap_B of FIG. 2B is greater than the distance gap_A of FIG. 2A.

Regarding the routing patterns, the long axes of routing patterns 206B(1)-206B(12) are aligned with corresponding tracks of the second imaginary grid, namely track_B(j), track_B(j+1), . . . , track_B(j+10) and track_B(j+11), where j is an integer and j≥0. Tracks of the second imaginary grid have the pitch, P_rte. A midpoint of gap_B is located in a gap between corresponding neighboring routing segments 205B (3) and 206B(4), whereas a midpoint of gap_A represents a point along track_B(j+2).

An even number of routing patterns, namely 206B(1)-206B(6), are distributed vertically between PG patterns 202B(1) and 204B. In FIG. 2B, the number of routing patterns distributed vertically between PG patterns 202B(1) and 204B is six. In some embodiments, the number of routing patterns distributed vertically between PG patterns 202B(1) and 204B is an even number other than six.

The distribution of routing patterns 206B(1)-206B(6) is substantially uniform in the vertical direction with respect to a midpoint of gap_B. In some embodiments, such uniform distribution of routing patterns 206B(1)-206B(5) with respect to the midpoint of gap_B(which, again, is the distance between PG patterns 202B(1) and 204B) is referred to as PG-adapted route-spacing.

Each of routing patterns 206B(1)-206B(10) has the vertical size SB(2). In some embodiments, SB(2) is an integer multiple of a minimum vertical line size which can be fabricated according to the corresponding semiconductor process technology node. In some embodiments, SB(2) is the minimum vertical line size.

Neighboring ones of routing patterns 206B(1)-206B(6) are separated vertically by the distance gap_rte. For example, routing patterns 206B(1) and 206B(2) are separated by the distance gap_rte.

Routing pattern 206B(1) is vertically separated from PG pattern 202B(1) by a distance gap_even. Routing pattern 206B(6) is vertically separated from PG pattern 204B by the distance gap_even. In FIG. 2B, gave_even is smaller than gap_odd of FIG. 2A. In some embodiments, gap_even is substantially the same as gap_rte. In FIG. 2B, gap_even is larger than gap_rte.

As noted, according to another approach, the long axes of the first and second PG segments and the first routing segments in layer M_$3^{rd}$ are aligned with corresponding tracks of the same imaginary grid. Assuming that (1) a vertical size of standard cells according to the other approach are the same size as a vertical size of cells 201B(1) and 201B(2), that (2) a vertical size of routing patterns according to the other approach is the same as SB(3) of routing segments 206B(1)-206B(12), and that (3) a vertical size of PG segments according to the other approach as the same as the vertical size of PG segments 202B(1), 202B(2) and 204B, then the PG-adapted route-spacing of layout diagram 200B has an advantage as compared to the spacing of routing patterns according to the other approach. In some embodiments, the advantage of the PG-adapted route-spacing of layout diagram 200B is that there are six routing segments per cell distributed between corresponding PG segments 202B(1), 202B(2) and 204B, as compared to five corresponding routing segments between the PG segments according to the other approach. As compared to the other approach, in some embodiments, the greater number or routing segments provides greater routing flexibility, e.g., without suffering an otherwise corresponding increase in the vertical size of cells 202B(1) and 202B(2).

Figure 3:
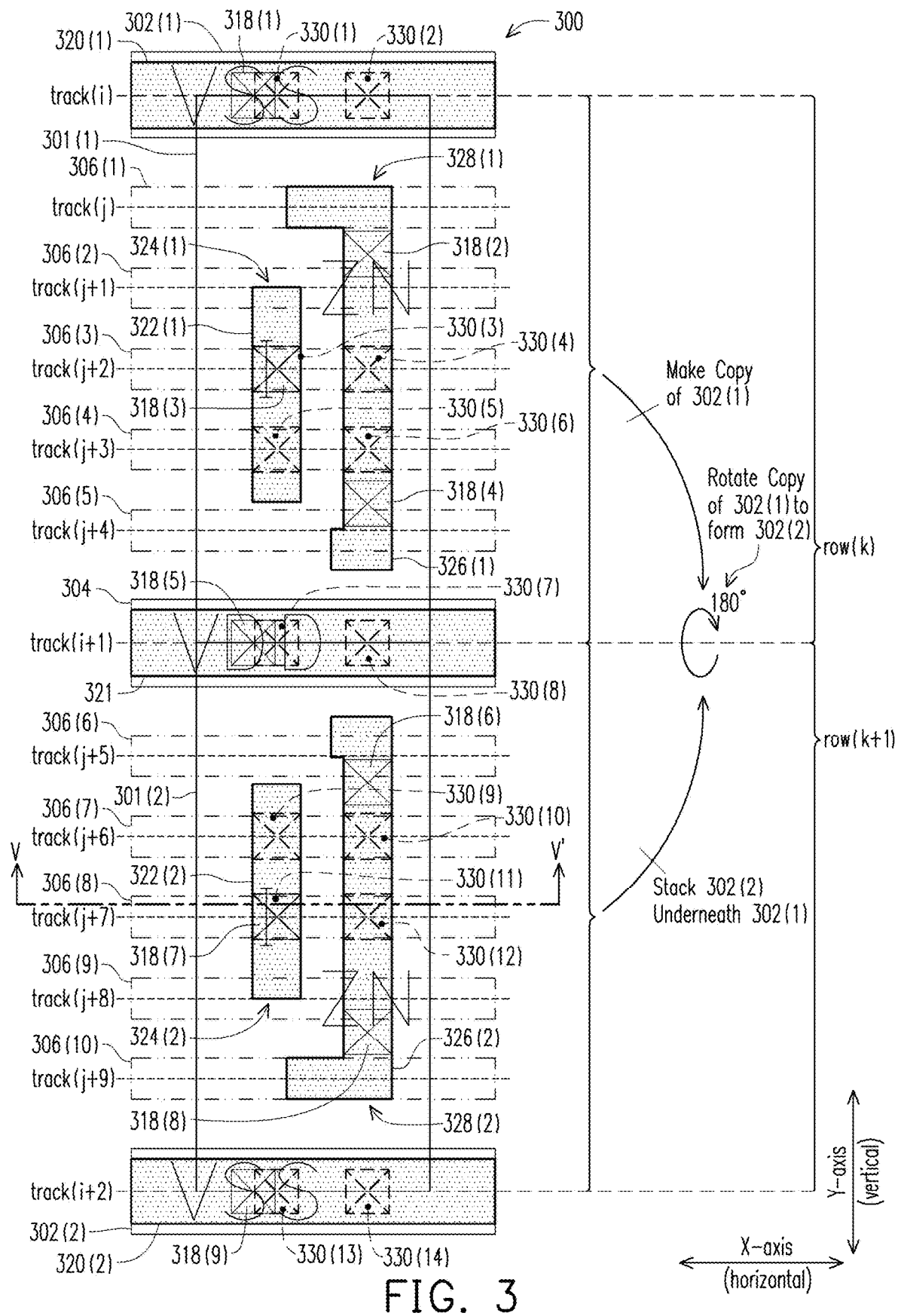
FIG. 3 is a layout diagram, in accordance with at least one embodiment of the present disclosure.

FIG. 3 is a layout diagram 300, in accordance with at least one embodiment of the present disclosure. An example of a cell region based on layout diagram 300 is cell region 104 included semiconductor device 100 of FIG. 1.

Layout diagram 300 of FIG. 3 is similar to layout diagram 200A of FIG. 2B. Corresponding elements are indicated with similar alphanumeric references albeit with alphanumeric references in FIG. 3 not including a letter "A" whereas alphanumeric references in FIG. 2A include the letter "A." For example, consider cell 301(1) in layout diagram 200A of FIG. 2A and corresponding cell 201A(1) in layout diagram 200A of FIG. 2A. For the sake of brevity, the discussion will focus on differences of layout diagram 300 with respect to layout diagram 200A.

Layout diagram 300 includes: a layer VIA(h−2) of interconnection; a layer M(h−1) of metallization on layer VIA(h−2); a layer VIA(h−1) of interconnection on layer M(h−1); and a layer M(h) of metallization on VIA(h−1), where h is an integer and h≥2. In some embodiments layer: VIA(h−2) is a first layer, VIA_$1^{st}$, of interconnection; layer M(h−1) is a second layer, M_$2^{nd}$, of metallization; layer VIA(h−1) is a second layer, VIA_$2^{nd}$, of interconnection; and layer M(h) is a third layer M_$3^{rd}$, of metallization. In some embodiments, a layer M(h−2), represents a first layer, M_$1^{st}$, of metallization, and is located below first layer VIA_$1^{st}$ of interconnection. In some embodiments, where the first layer M_$1^{st}$ is M(0) and h=2, then M(h−1) is M(1) and M(h)=M(2).

In layout diagram 300, Layer VIA(h−2) of interconnection includes interconnect patterns, e.g., via patterns 318(1)-318(9). In some embodiments, some of via patterns 318(1)-318(9) are disposed directly on corresponding MOOP contact patterns (also known as MP contact patterns), the latter representing MOOP contacts (also known as MP contacts) (see FIG. 5). In some embodiments, some of via patterns 318(1)-318(9) are disposed directly on corresponding MOOD contact patterns (also known as MD contact patterns), the latter representing MOOD contacts (also known as MD contacts) (see FIG. 5). A cross-section line V-V' in FIG. 3 shows the relationship to FIG. 5, the cross-section line V-V' being located proximal to track (j+7).

In layout diagram 300, layer M(h−1) includes segment patterns, the segment patterns including PG patterns 320(1), 320(2) and 321, and input/output patterns (pin patterns) 322(1), 322(2), 326(1) and 326(2). Standard cell 301(1), which is disposed in row (k), includes pin patterns 322(1) and 326(1), and portions of PG patterns 320(1) and 321. Standard cell 301(2), which is disposed in row (k+1), includes pin patterns 322(2) and 326(2), and portions of PG patterns 321 and 320(2). Each of cells 301(1) and 301(2) is a standard logical inverter cell which correspondingly represent an inverter gate (circuit) in a corresponding semiconductor device. In cell 301(1), pin pattern 322(1) represents an input pin and pin pattern 326(1) represents an output pin. In cell 301(2), pin pattern 322(2) represents an input pin and pin pattern 326(2) represents an output pin.

In some embodiments: PG patterns 320(1), 320(2) and 321 are directly disposed on and overlap corresponding via patterns 318(1), 318(5) and 318(9); pin patterns 322(1) and 322(2) are directly disposed on and overlap corresponding via patterns 318(3) and 318(7); and pin patterns 326(1) and 326(2) are directly disposed on and overlap corresponding via patterns 318(2), 318(4), 318(6) and 318(8).

In some embodiments in which layer M(h−1) is the second layer M_$2^{nd}$ of metallization, regarding layout diagrams on which are based corresponding semiconductor devices, and more particularly regarding segment patterns including PG patterns and second routing patterns, there are design rules for generating layout diagrams. In such embodiments, a 'feasible-via' design rule constrains a location and size of a segment pattern in the layer M(h−1) with respect to tracks in an imaginary routing grid for the overlying layer M(h), the latter being the third layer M_$3^{rd}$ of metallization in such embodiments. In such embodiments, according to the feasible-via design rule, each segment pattern in layer M(h−1) is to be: located so as to intersect tracks for the layer M(h) at two or more corresponding candidate intersections; and sized so that if a via in a layer VIA(h−1) were located at a given candidate intersection, then the via would be at least substantially completely overlapped by the segment pattern in layer M(h−1). The feasible-via is so named because it results in at least two vias, each of which is feasible because it is substantially completely overlapped by the corresponding segment in layer M(h−1).

In layout diagram 300, layer VIA(h−1) of interconnection includes via patterns 330(1)-330(14). Also in layout diagram 300, layer M(h) includes segment patterns, the segment patterns including: PG patterns 302(1), 302(2) and 304; and routing patterns 306(1)-306(1).

In layout diagram 300, the long axis of PG pattern 320(1) is located so as to align with track (i) of layer M(h), and is sized so as to substantially completely overlap at least via patterns 330(1) and 330(2). The long axis of pin pattern 322(1) is located such that pin pattern 322(1) intersects track (j+2) and track (j+3) of layout M(h), and is sized so as to substantially completely overlap at least via patterns 330(1) and 330(2). The long axis of pin pattern 322(2) is located such that pin pattern 322(2) intersects track (j+6) and track (j+7) of layout M(h), and is sized so as to substantially completely overlap at least via patterns 330(9) and 330(11). The long axis of pin pattern 326(1) is located such that pin pattern 326(1) intersects track (j), track (j+1), track (j+2), track (j+3) and track (j+4) of layout M(h), and is sized so as to substantially completely overlap at least via patterns 330(4) and 330(6). The long axis of pin pattern 326(2) is located such that pin pattern 326(2) intersects track (j+5), track (j+6), track (j+7), track (j+8) and track (j+9) of layout M(h), and is sized so as to substantially completely overlap at least via patterns 330(10) and 330(12).

In some embodiments, both of via patterns 330(1) and 330(2) are used to connect to overlying PG pattern 302(1). In some embodiments, one of via pattern 330(1) or via pattern 330(2) is used to connect to overlying PG pattern 302(1). Accordingly, via patterns 330(1) and 330(2) are shown with phantom (dashed) lines in FIG. 3. In some embodiments, both of via patterns 330(4) and 330(6) are used to connect to overlying corresponding routing patterns 306(3) and 306(4). In some embodiments, one of via patterns 330(4) or 330(6) is used to connect to overlying corresponding routing patterns 306(3) or 306(4). In some embodiments, other via patterns (not shown) in layer VIA(h−1) are used to connect to routing patterns 306(1) and/or 306(2) instead or in addition to the noted use of via patterns 330(4) and/or 330(6). Accordingly, via patterns 330(4) and 330(6), and routing patterns 306(1)-306(5) are shown with phantom (dashed) lines in FIG. 3. Similar circumstances are true for via patterns 330(3)-330(14) and routing patterns 306(6)-306(10). Accordingly, via patterns 330(3)-330(14) and routing patterns 306(6)-306(10) are shown with phantom (dashed) lines in FIG. 3.

In some embodiments, track (i+1) represents an axis of mirror symmetry such that cell 301(2) is mirror-symmetric with respect to cell 301(1). In some embodiments, a method of generating cell 301(2) in layout diagram 300 includes: making a copy of cell 301(1); aligning a bottom edge of the copy of cell 301(1) with track (i+1) such that a long axis of PG segment 321 is aligned with track (i+1); rotating the copy of cell 301(1) around track (i+1) by 180°; disposing the rotated copy of cell 301(1) as cell 301(2) in row (k+1); and aligning cell 301(2) of row (k+1) with cell 301(1) of row (k) in a stacked arrangement.

An example manifestation of the mirror symmetry in layout diagram 300 is corresponding pin patterns 322(1) and 322(2). Pin pattern 322(1) has an end 324(1) which is substantially aligned with track (j+1) and is located a distance of four tracks from the axis of symmetry track (i+1). In a sequence extending radially away from the axis of symmetry track (i+1), the four tracks are track (j+4), track (j+3), track (j+2) and track (j+1). Corresponding pin pattern 322(2) has an end 324(2) which is substantially aligned with track (j+8) and is located a distance of four tracks from the axis of symmetry track (i+1). In a sequence extending radially away from the axis of symmetry track (i+1), the four tracks are track (j+5), track (j+6), track (j+7) and track (j+8).

Another example manifestation of the mirror symmetry in layout diagram 300 is corresponding pin patterns 326(1) and 326(2). Pin pattern 326(1) includes, at opposite ends thereof, a long foot 328(1) and a short foot (not called out with a reference number). Long foot 328(1) is substantially aligned with track (j). Long foot 328(1) is located a distance of five tracks from the axis of symmetry track (i+1). In a sequence extending radially away from the axis of symmetry track (i+1), the five tracks are track (j+4), track (j+3), track (j+2), track (j+1) and track (j). Corresponding pin pattern 326(2) includes, at opposite ends thereof, a long foot 328(2) and a short foot (not called out with a reference number). Long foot 328(2) is substantially aligned with track (j+9). Long foot 328(2) is located a distance of five tracks from the axis of symmetry track (i+1). In a sequence extending radially away from the axis of symmetry track (i+1), the five tracks are track (j+5), track (j+6), track (j+7), track (j+8) and track (j+9).

The mirror symmetry of layout diagram 300 is a result of the PG-adapted route-spacing of track (j)-track (j+4) and the PG-adapted route-spacing of track (j+5)-track (j+9). According to another approach which does not use PG-adapted route-spacing, attempting to stack a mirrored version of a standard inverter cell on a non-mirrored version of the standard inverter cell results in one of the two versions of the standard inverter cell failing to comply with the feasible-via design rule noted above. Again, the feasible-via design rule is that each segment pattern in layer M(h−1) is to be: located so as to intersect tracks for the layer M(h) at two or more corresponding candidate intersections; and sized so that if a via in a layer VIA(h−1) were located at a given candidate intersection, then the via would be at least substantially completely overlapped by the segment pattern in layer M(h−1). In order to comply with the feasible-via design rule, the other approach provides two versions of the standard inverter cell, namely a first version of the standard inverter cell per se and a quasi-mirror-symmetric second version having an arrangement which has been adjusted to comply with the feasible-via design rule, which thereby inflates a size of a corresponding library in which the two versions of the standard inverter cell are included. Furthermore, extrapolating to include standard cells representing other logical functions, a result of the other approach, in effect, is a dual library scenario in which two libraries are needed, namely a first library of first versions of cells and a second library of corresponding quasi-mirror-symmetric second versions of the cells. A disadvantage of the dual library scenario according to the other approach is that the overall 'library' size is substantially inflated An advantage of at least some embodiments which use PG-adapted route-spacing and have standard cells which whose mirror-symmetric versions comply with the feasible-via design rule is that that a library which includes such standard cells does not experience the size inflation suffered by the other approach.

Figure 4:
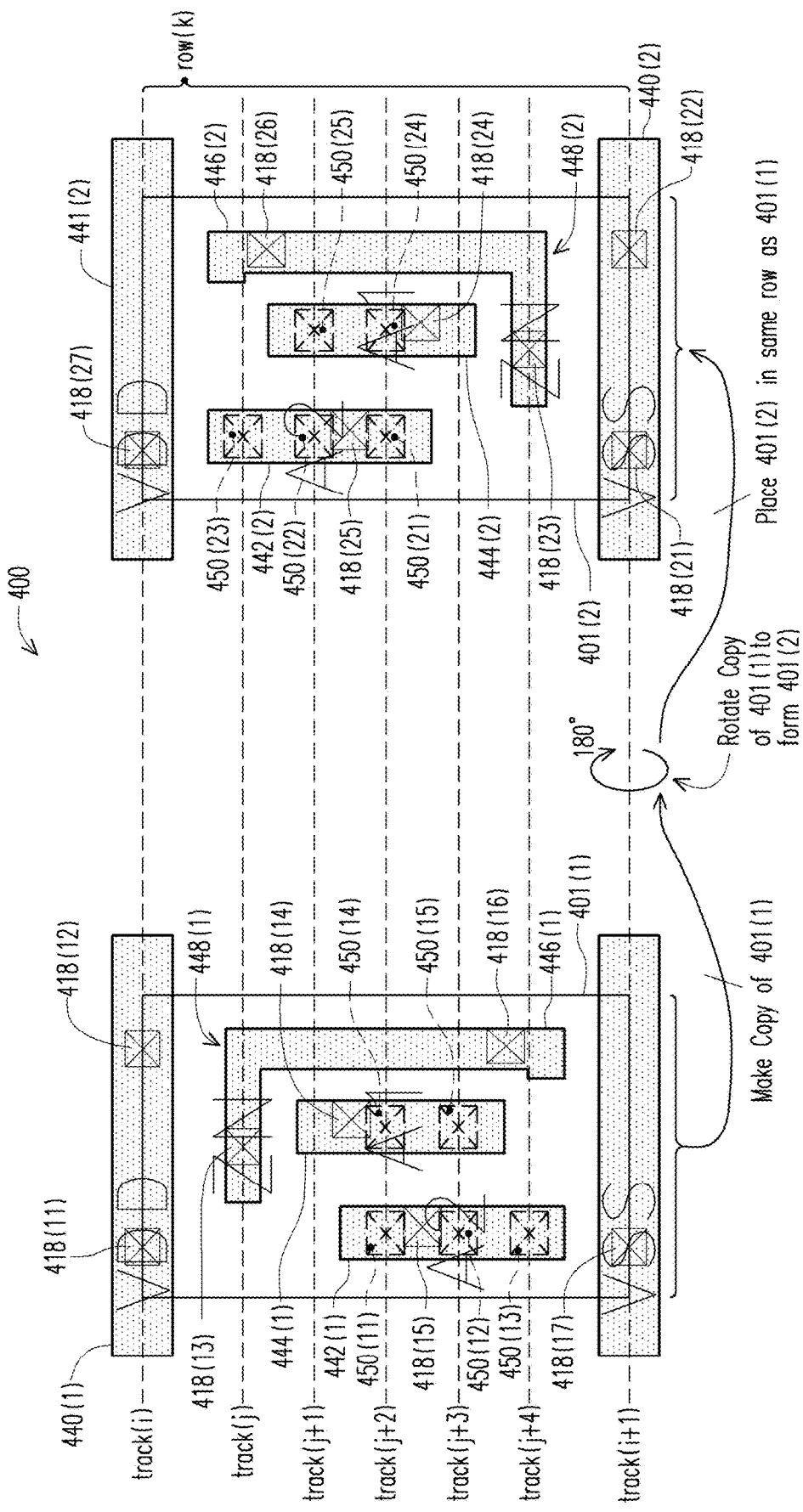
FIG. 4 is a layout diagram, in accordance with at least one embodiment of the present disclosure.

FIG. 4 is a layout diagram 400, in accordance with at least one embodiment of the present disclosure. An example of a cell region based on layout diagram 400 is cell region 104 included semiconductor device 100 of FIG. 1.

Layout diagram 400 of FIG. 3 is similar to layout diagram 300 of FIG. 3. Corresponding elements are indicated with similar alphanumeric references albeit with references in FIG. 4 beginning with "4" whereas references in FIG. 3 begin with "3." For example, consider cell 401(1) in layout diagram 400 of FIG. 4 and corresponding cell 301(1) in layout diagram 300 of FIG. 3. For the sake of brevity, the discussion will focus on differences of layout diagram 400 with respect to layout diagram 300. For example, recalling that layout diagram 300 includes tracks for layer M(h), namely track (i)-track (i+2) and track (j)-track (j+9), and PG patterns 302(1), 302(2) and 304 and routing patterns 306(1)-306(10) in layer M(h), though layout diagram 400 includes tracks for layer M(h), namely track (i)-track (i+1) and track (j)-track (j+4), no segment patterns are shown in layout 300 for layer M(h) (again, for the sake of brevity).

Layout diagram 400 includes: a layer VIA(h−2) of interconnection; a layer M(h−1) of metallization on layer VIA(h−2); and a layer VIA(h−1) of interconnection on layer M(h−1), where h is an integer and h≥2. In some embodiments layer: VIA(h−2) is a first layer, VIA_$1^{st}$, of interconnection; layer M(h−1) is a second layer, M_$2^{nd}$, of metallization; and layer VIA(h−1) is a second layer, VIA_$2^{nd}$, of interconnection.

In layout diagram 400, layer VIA(h−2) of interconnection includes interconnect patterns, e.g., via patterns 418(11)-418(17) and 418(21)-418(27).

Layer M(h−1) includes segment patterns, the segment patterns including PG patterns 440(1), 440(2), 441(1) and 441(2), and pin patterns 442(1), 442(2), 444(1), 442(2), 446(1) and 446(2).

Each of standard cells 401(1) and 401(2) is disposed in row (k). Standard cell 401(1) includes pin patterns 442(1), 444(1) and 446(1) and portions of PG patterns 440(1) and 441(1). Standard cell 401(2) includes pin patterns 442(2), 444(2) and 446(2) and portions of PG patterns 440(2) and 441(2).

Each of cells 401(1) and 401(2) is a standard AND cell which correspondingly represents a logical AND gate (circuit) in a corresponding semiconductor device. In cell 401(1), pin patterns 442(1) and 444(1) represent corresponding input pins and pin pattern 446(1) represents an output pin. In cell 401(2), pin patterns 442(2) and 444(2) represent corresponding input pins and pin pattern 446(2) represents an output pin.

In some embodiments: PG patterns 440(1) and 440(2) are directly disposed on and overlap corresponding via patterns 418(11), 418(12), 418(21) and 418(22); PG patterns 441(1) and 441(2) are directly disposed on and overlap corresponding via patterns 418(17 and 418(27); pin patterns 442(1) and 441(1) are directly disposed on and overlap corresponding via patterns 418(15) and 418(14); pin patterns 442(2) and 441(2) are directly disposed on and overlap corresponding via patterns 418(25) and 418(24); and pin patterns 446(1) and 446(2) are directly disposed on and overlap corresponding via patterns 418(13), 418(16), 418(23) and 418(26).

In layout diagram 300, layer VIA(h−1) of interconnection includes via patterns 450(11)-450(15) and 450(21)-450(25).

In some embodiments, track (i+1) represents an axis of mirror symmetry such that cell 401(2) would be mirror-symmetric with respect to cell 401(1) if cell 401(2) were stacked underneath cell 401(1). In some embodiments, a method of generating cell 401(2) in layout diagram 400 includes: making a copy of cell 401(1); aligning a bottom edge of the copy of cell 401(1) with track (i+1) such that a long axis of PG segment 441(1) in the copy of cell 401(1) is aligned with track (i+1), where PG segment 441(1) in the copy of cell 401(1) will become PG segment 441(2); rotating the copy of cell 401(1) around track (i+1) by 180°; and disposing the rotated copy of cell 401(1) as cell 401(2) in row (k) such that PG segments 441(2) and 440(2) are aligned correspondingly with track (i) and track (i+1).

An example manifestation of the mirror symmetry in layout diagram 400 is corresponding pin patterns 446(1) and 4466(2). Pin pattern 446(1) includes, at opposite ends thereof, a long foot 448(1) and a short foot (not called out with a reference number). Long foot 448(1) is substantially aligned with track (j). Long foot 448(1) is located a distance of five tracks from the axis of symmetry track (i+1). In a sequence extending radially away from the axis of symmetry track (i+1), the five tracks are track (j+4), track (j+3), track (j+2), track (j+1) and track (j). Corresponding pin pattern 446(2) includes, at opposite ends thereof, a long foot 448(2) and a short foot (not called out with a reference number). Long foot 448(2) is substantially aligned with track (j+4). Long foot 448(2) is located a distance of one track from the axis of symmetry track (i+1). In a sequence extending radially away from the axis of symmetry track (i+1), the one track is track (j+4).

The mirror symmetry of layout diagram 400 in FIG. 4, similar to the layout diagram 300 of FIG. 3, is a result of the PG-adapted route-spacing of track (j)-track (j+4). According to another approach which does not use PG-adapted route-spacing, attempting to place a mirrored version of a standard AND cell in a same row as a non-mirrored version of the standard AND cell results in one of the two versions of the standard AND cell failing to comply with the feasible-via design rule noted above. Again, the feasible-via design rule is that each segment pattern in layer M(h−1) is to be: located so as to intersect tracks for the layer M(h) at two or more corresponding candidate intersections; and sized so that if a via in a layer VIA(h−1) were located at a given candidate intersection, then the via would be at least substantially completely overlapped by the segment pattern in layer M(h−1).

In order to comply with the feasible-via design rule, the other approach provides two versions of the standard AND cell, namely a first version of the standard AND cell per se and a quasi-mirror-symmetric second version having an arrangement which has been adjusted to comply with the feasible-via design rule, which thereby inflates a size of a corresponding library in which the two versions of the standard AND cell are included. Furthermore (again), according to the other approach, standard cells representing other logical functions must be represented in two versions (regular and quasi-mirror-symmetric), which thereby inflates the size of the corresponding library all the more. Again, an advantage of at least some embodiments which use PG-adapted route-spacing and have standard cells which whose mirror-symmetric versions comply with the feasible-via design rule is that that a library which includes such standard cells does not experience the size inflation suffered by the other approach.

Alternatively, according to some embodiments, for layer M(h) as discussed above, a given standard logical cell (given cell) includes: tracks for layer M(h) which uses PG-adapted route-spacing; and segment patterns including PG patterns and routing patterns. The given cell can be configured in two manners (first and second manners), with each manner correspondingly connecting first and second reference voltages and input(s) and output(s) resulting in two corresponding logical functions. The first and second manners of configuration transform the given cell from a common pre-configuration arrangement into corresponding first and second post-configuration arrangements.

The first manner of configuring the given cell assumes the use of an unmirrored version of the given cell and results in the first post-configuration arrangement which represents the first logical function. The second manner of configuring the given cell assumes the use of a mirrored version of the given cell and results in the second post-configuration arrangement which represents the second logical function.

An advantage of such the given cell is the increased size of PG patterns under the first post-configuration and the increased number of available routing tracks under the second post-configuration, with each of the first and second post-configuration arrangements complying with the feasible-via design rule noted above, all the while avoiding the dual library scenario according to the other approach. Again, the feasible-via design rule is that each segment pattern in layer M(h−1) is to be: located so as to intersect tracks for the layer M(h) at two or more corresponding candidate intersections; and sized so that if a via in a layer VIA(h−1) were located at a given candidate intersection, then the via would be at least substantially completely overlapped by the segment pattern in layer M(h−1).

Examples pairs of logical functions represented by corresponding first and second post-configuration are included in the following table.

| Logical Function of First Post-Configuration Arrangement | Logical Function of First Post-Configuration Arrangement |
|---|---|
| AND-invert-OR-invert (AIOI) | OR-invert-AND-invert (OIAI)- |
| AND (AN) | OR- |
| AND-OR (AO) | OR-AND (OA) |
| AND-OR-AND-invert (AOAI) | OR-AND-OR-invert (OAOI) |
| AND-OR-invert (AOI) | OR-AND-invert (OAI) |
| D flip-flop with non-inverted output Q (DFQ) | D flip-flop with inverted output Q (DFNQ) |
| invert-AND-OR (IAO) | invert-OR-AND (IOA) |
| invert-invert-NAND (IIND) | invert-invert-NOR (IINR) |
| invert-NAND (IND) | invert-NOR (INR) |
| NAND (ND) | NOR (NR) |
| exclusive-NOR (XNR) | exclusive-OR (XOR) |

Figure 5:
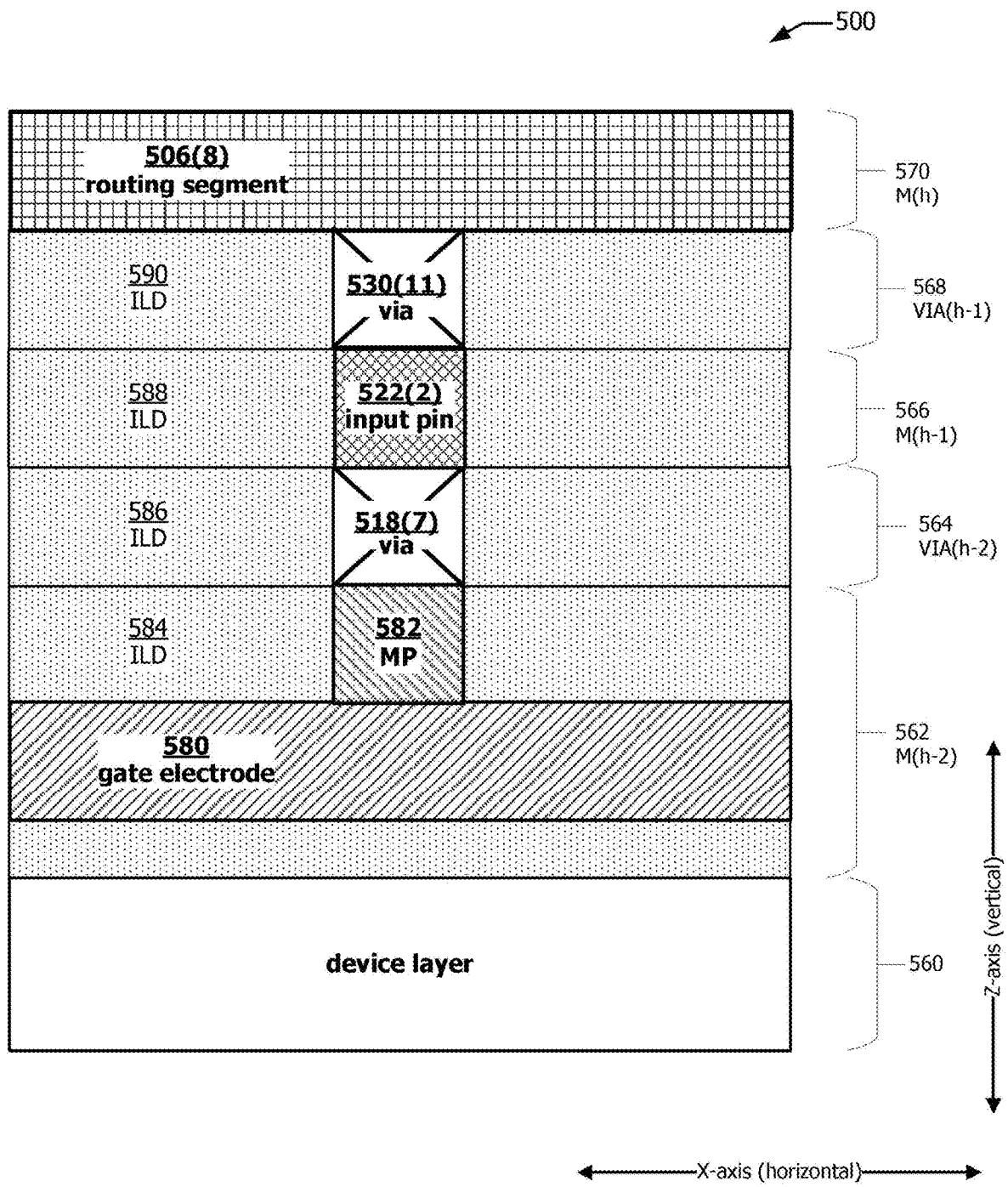
FIG. 5 is a cross-section of a portion of a semiconductor device, in accordance with some embodiments.

FIG. 5 is a cross-section of a portion 500 of a semiconductor device, in accordance with some embodiments.

Portion 500 is an example of a portion of a semiconductor device which is fabricated based on a layout diagram such as layout diagram 300 of FIG. 3, or the like. As such, portion 500 is an example of portion included in cell region 104 of semiconductor device 100 of FIG. 1. The relationship of FIG. 5 to FIG. 3 is shown by the cross-section line V-V' in FIG. 3.

Portion 500 includes layers 560, 562, 564, 566, 568 and 570. Layer 562 is formed over layer 560. Layer 564 is formed over layer 562. Layer 566 is formed over layer 564. Layer 568 is formed over layer 566. Layer 570 is formed over layer 568. In some embodiments, layer 562 is formed directly on layer 560. In some embodiments, layer 564 is formed directly on layer 562. In some embodiments, layer 566 is formed directly on layer 564. In some embodiments, layer 568 is formed directly on layer 566. In some embodiments, layer 570 is formed directly on layer 568.

Layer 560 represents a device layer. In some embodiments, the semiconductor device is a CMOS device such that layer 560 includes a substrate (not shown), NMOS active regions (not shown) formed in the substrate, PMOS active regions (not shown) formed in an N-well (not shown) with the N-well being formed in the substrate, or the like.

Layer 562 represents a first layer M(h−2), e.g., M(0), of metallization, where h is an integer and h≥2. In FIG. 5, layer 562 includes: a gate electrode 580; a plug 582 which is electrically conductive; and an interlayer dielectric (ILD) 584. Volume in layer 562 not otherwise occupied by gate electrode 580, first plug 582, or the like, is filled by ILD 584. In FIG. 5, first plug 582 is formed over, and electrically connected to, gate electrode 580. In some embodiments, gate electrode 580 is formed of polysilicon.

In some embodiments, first plug 582 is referred to as a contact, and is electrically conductive. In some embodiments, examples of first plug 582 are disposed directly on corresponding portions of gate electrodes. In some embodiments, layer M(0) 562 further includes other gate electrodes in addition to gate electrode 580 and other instances of first plug 582. In some embodiments, the gate electrodes are formed of polysilicon. In some embodiments, examples of first plug 582 extend between an upper surface of layer M(0) 562 and upper surfaces of corresponding portions of the gate electrodes. In some embodiments, examples of first plug 582 are referred to as a metal-zero-over-polysilicon (MOOP, or more simply MP) contacts.

In some embodiments, layer M(0) 562 further includes one or more second plugs (not shown); one or more gate electrodes in addition to gate electrode 580, one or more gate insulators, or the like. The second plugs are electrically conductive. In some embodiments, the second plugs are referred to as contacts. The second plugs extend between upper and lower surfaces of layer M(0) 562. In some embodiments, gate insulators (not shown) are formed between selected portions of gate electrode 580 and corresponding channel regions within active regions in device layer 560.

In some embodiments, at least some of the second plugs are disposed directly on corresponding portions of NMOS active regions (again, not shown) in device layer 560, where the portions of the NMOS active regions represent corresponding source/drain (S/D) regions of transistors. In some embodiments, at least some of the second plugs are disposed directly on corresponding portions of PMOS active regions (again, not shown) in device layer 560, where the portions of the PMOS active regions represent corresponding S/D regions of transistors, and where the PMOS active regions are located in corresponding first parts (not shown) of N-wells (not shown). In some embodiments, at least some of the second plugs are disposed directly on corresponding second parts (not shown) of N-wells (again, not shown) in device layer 560, the second parts of the N-wells not including PMOS active regions. In some embodiments, the second parts of the N-wells surround the first parts of the N-wells (the latter in which, again, are located correspondingly the PMOS active regions). In some embodiments, whether directly disposed on NMOS active regions or PMOS active regions or N-wells outside of corresponding PMOS active regions, the second plugs are referred to as a metal-zero-over-drain (MOOD, or more simply MD) contacts.

Layer 564 represents a first layer VIA(h−2), e.g., VIA(0), of interconnection, e.g., including structures such as vias. Layer 564 includes a via 518(7) and an ILD 586. Volume in layer 564 not otherwise occupied by via 518(7) or the like is filled by ILD 586. Via 518(7) corresponds to via pattern 318(7) in FIG. 3. Via 518(7) is electrically connected to, and substantially aligned with, plug 582.

Layer 566 represents a second layer M(h−1), e.g., M(1), of metallization. Layer 566 includes pin 522(2) and an ILD 588. Volume in layer 566 not otherwise occupied by pin 522(2) or the like is filled by ILD 588. Pin 522(2) represents an input to a circuit and corresponds to pin pattern 322(2) of FIG. 3. Pin 522(2) is electrically connected to via 518(7).

Layer 568 represents a second layer VIA(h−2), e.g., VIA(1), of interconnection, e.g., including structures such as vias. Layer 568 includes a via 530(11) and an ILD 590. Volume in layer 568 not otherwise occupied by via 530(11) or the like is filled by ILD 590. Via 530(11) corresponds to via pattern 330(11) in FIG. 3. Via 530(11) is electrically connected to, and substantially aligned with, pin 522(2).

Layer 570 represents a third layer M(h), e.g., M(2), of metallization. Layer 570 includes a routing segment 506(8) and an ILD (not shown). Volume in layer 570 not otherwise occupied by routing segment 506(8) or the like is filled by the ILD of layer 570. Routing segment 506(8) corresponds to routing pattern 306(8) of FIG. 3. Routing segment 506(8) is electrically connected to via 530(11).

Figure 6:
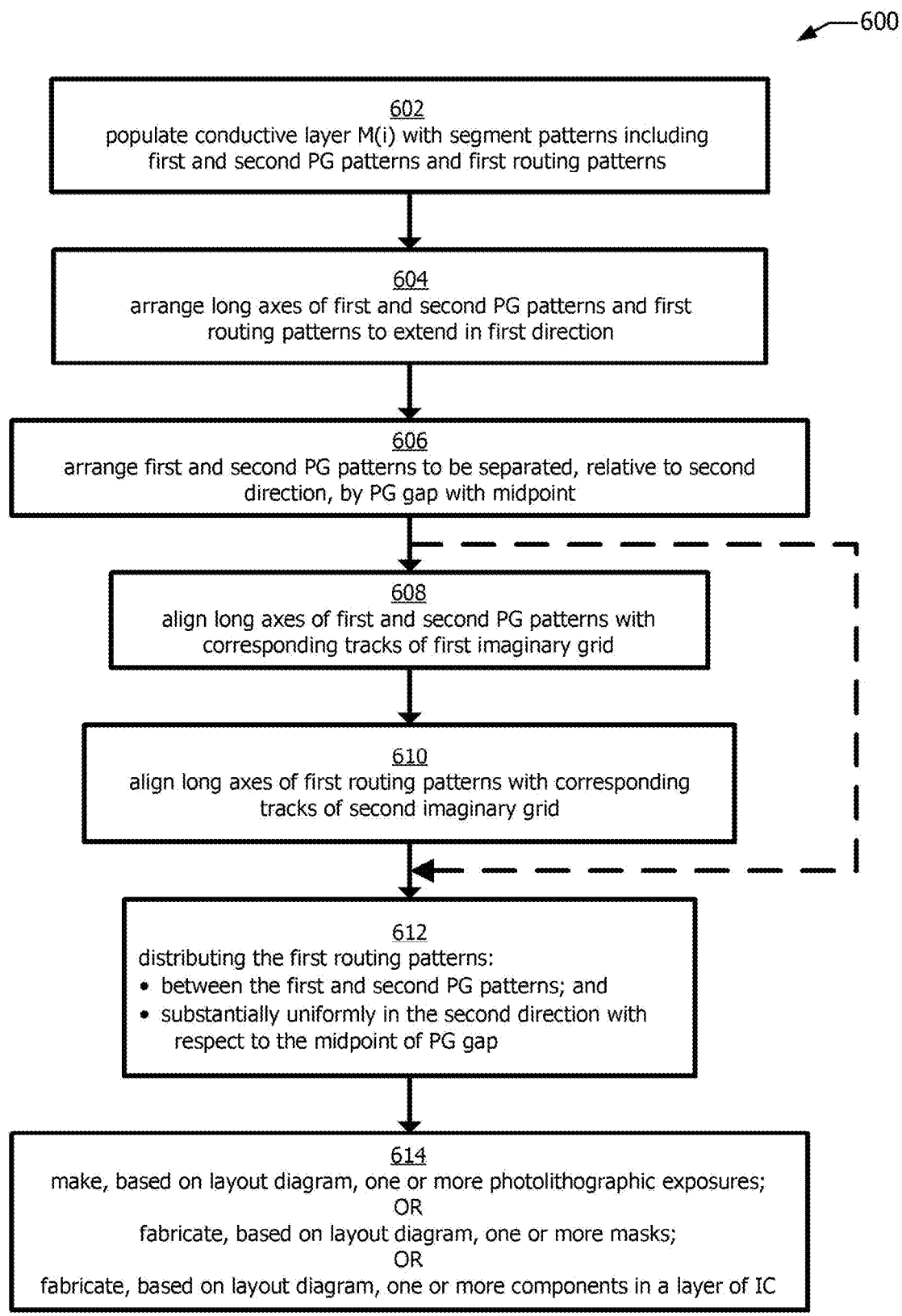
FIG. 6 is a flowchart of a method of generating a layout diagram of a semiconductor device, in accordance with some embodiments.

FIG. 6 is a flowchart of a method 600 of generating a layout diagram of a semiconductor device, in accordance with some embodiments.

Method 600 is implementable, for example, using EDA system 600(FIG. 7, discussed below), in accordance with some embodiments. The layout diagram is stored on a non-transitory computer-readable medium (see FIG. 7).

In FIG. 6, method 600 includes blocks 602-614. At block 602, a conductive layer M(h) is populated with segment patterns representing corresponding conductive segments in the semiconductor device. The segment patterns include first and second power grid (PG) patterns and first routing patterns, where h is an integer and h≥1. Examples of the PG patterns include: 202A(1), 202A(2) and 204A in FIG. 2A; 202B(1), 202B(2) and 204B in FIG. 2B; PG patterns 302(1), 302(2) and 304; or the like. Examples of the routing patterns include: routing patterns 206A(1)-206A(10) in FIG. 2A; routing patterns 206B(1)-206B(12) in FIG. 2B; routing patterns 306(1)-306(1); or the like. From block 602, flow proceeds to block 604.

At block 604, long axes of the first and second PG patterns and the first routing patterns are arranged to extend in a first direction. An example of the first direction is the X-axis and is described as being horizontal. From block 604, flow proceeds to block 606.

At block 606, the first and second PG patterns are arranged to be separated, relative to a second direction, by a PG gap with a midpoint. The second direction is substantially perpendicular to the first direction. An example of the second direction is the Y-axis and is described as being vertical. From block 606, flow proceeds to block 608.

At block 608, the long axes of the first and second PG patterns are aligned with corresponding tracks of a first imaginary grid. Examples of the first imaginary grid include: the grid in FIG. 2A which includes track_A(i), track_A(i+1) and track_A(i+2); the grid in FIG. 2B which includes track_B(i), track_B(i+1) and track_B(i+2); the grid in FIG. 3 which includes track (i), track (i+1) and track (i+2); the grid in FIG. 4 which includes track (i) and track (i+1); or the like. From block 608, flow proceeds to block 610. In some embodiments, flow proceeds from block 606 to block 612, as shown by the phantom (dashed) arrow. In some embodiments, flow proceeds from block 606 to block 610.

At block 610, the long axes of the first routing patterns are aligned with corresponding tracks of a second imaginary grid. Examples of the second imaginary grid include: the grid in FIG. 2A which includes track_A(j), track_A(j+1), . . . track_A(j+8) and track_A(j+9); the grid in FIG. 2B which includes track_B(j), track_B(j+1), . . . track_B(j+10) and track_(j+11); the grid in FIG. 3 which includes track (j), track (j+1), . . . track_(j+8) and track_(j+9); the grid in FIG. 4 which includes track (j), track (j+1), track (j+2), track (j+3) and track (j+4); or the like. From block 610, flow proceeds to block 612. In some embodiments, as noted, flow proceeds from block 608 to block 612, as shown (again) by the phantom (dashed) arrow. In some embodiments, flow proceeds from block 608 to block 610.

At block 612, the first routing patterns are distributed: between the first and second PG patterns; and substantially uniformly in the second direction with respect to the midpoint of the PG gap. In some embodiments, such distribution with respect to the midpoint of the PG gap is referred to as PG-adapted route-spacing. Examples of layout diagrams which exhibit PG-adapted route-spacing include layout diagrams 200A, 200B, 300 and 400 of corresponding FIGS. 2A, 2B, 3 and 4, or the like. From block 612, flow proceeds to block 614.

At block 614, based a layout diagram which includes the layout diagram of blocks 602-610, one or more of the following is performed based on the layout diagram: one or more lithographic exposures are made; one or more semiconductor masks are fabricated; or at least one component in a layer of a semiconductor integrated circuit is fabricated. See discussion below of FIG. 8.

Figure 7:
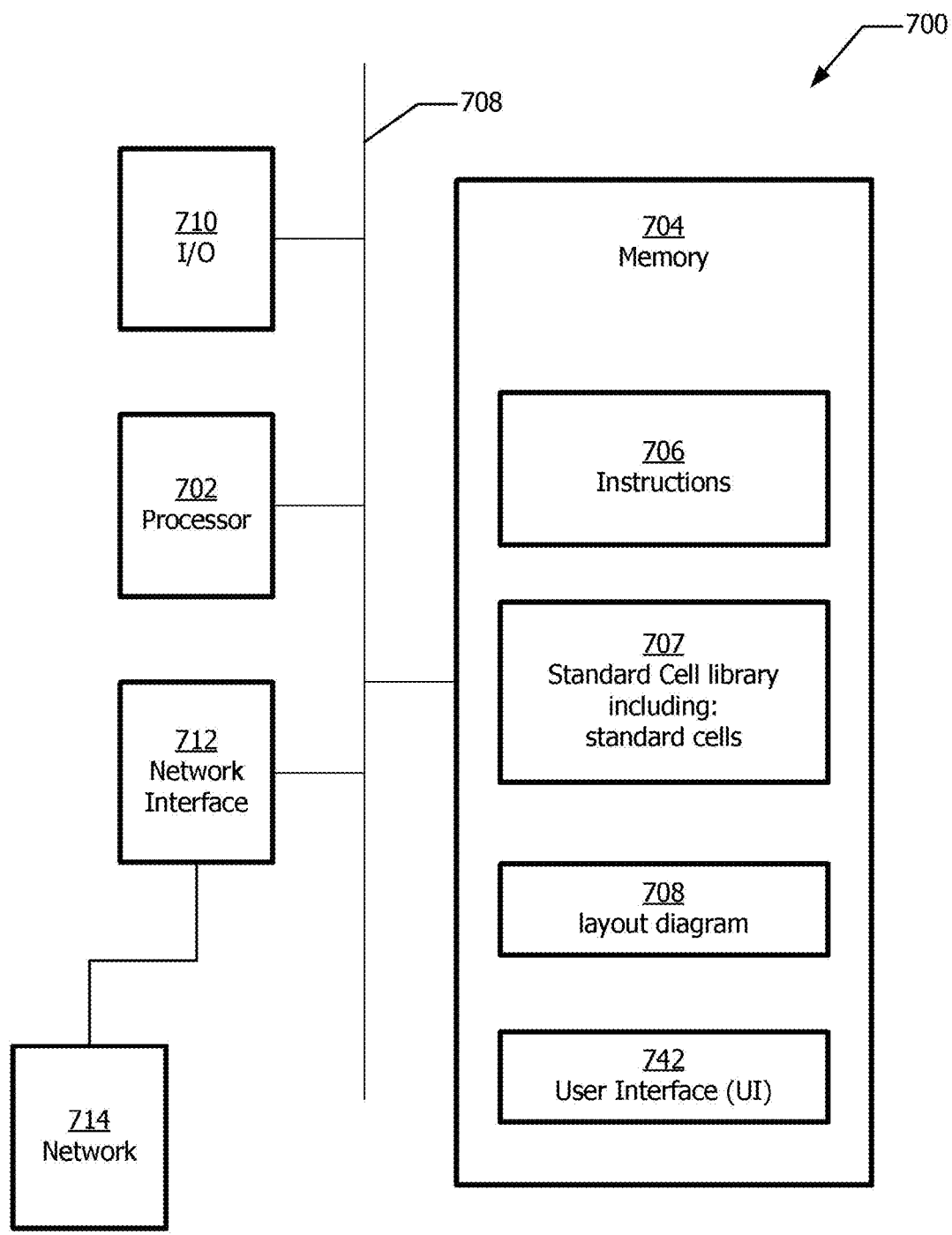
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an automatic placement and routing (APR) system. Methods described herein of generating PG layout diagrams, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the methods described herein in accordance with one or more (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code (instructions) 706 configured to cause system 700(where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein and one or more layout diagrams 708 such as are disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
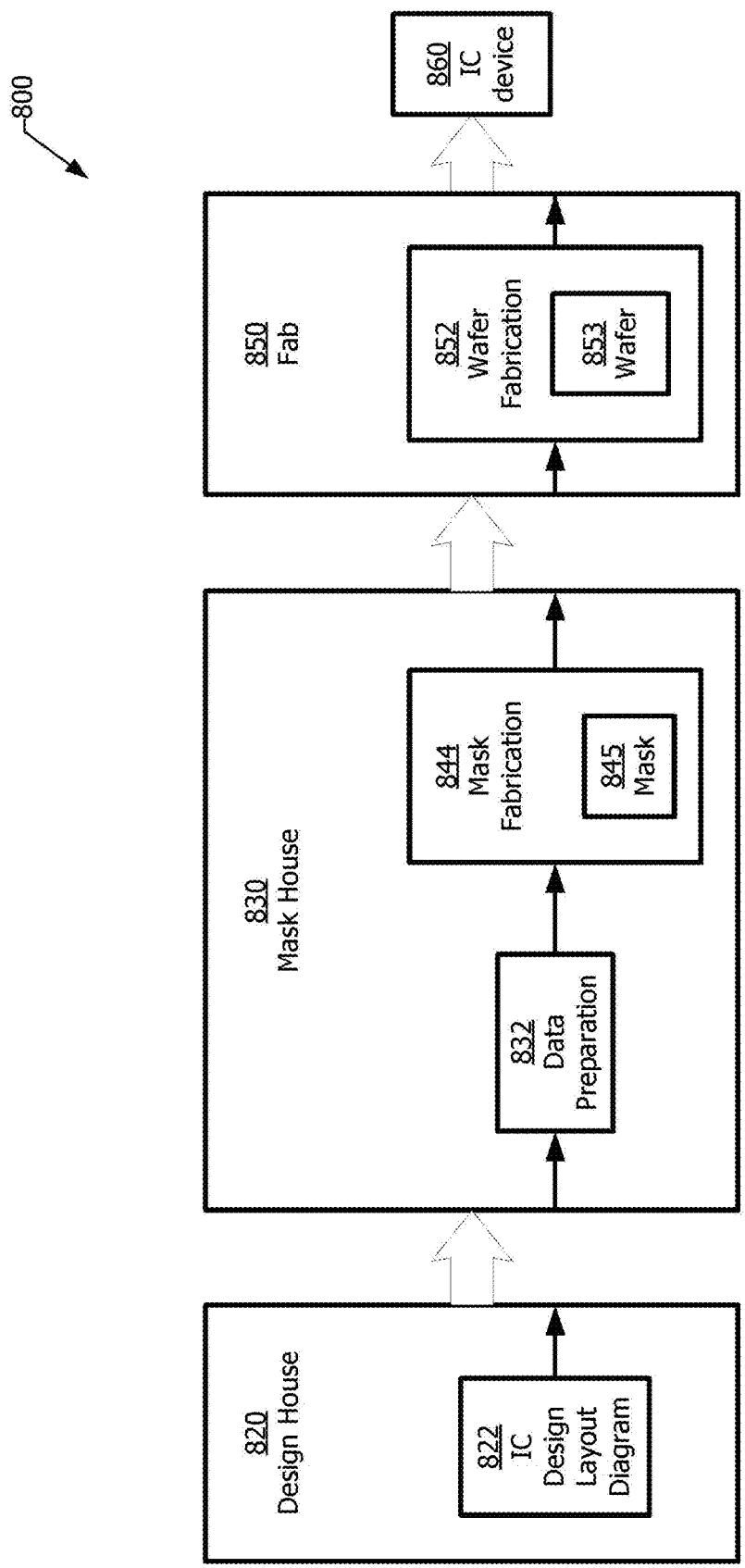
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

A system of one or more computers are configured to perform particular operations or actions by virtue of having software, firmware, hardware, or a combination of them installed on the system that in operation causes or cause the system to perform the actions. One or more computer programs are configured to perform particular operations or actions by virtue of including instructions that, when executed by data processing apparatus, cause the apparatus to perform the actions. In some embodiments, a method of generating a layout diagram of a semiconductor device includes populating a conductive layer M(h) with segment patterns representing corresponding conductive segments in the semiconductor device. The segment patterns including first and second power grid (PG) patterns and first routing patterns, where h is an integer and h≥1. Arranging long axes of the first and second PG patterns and the first routing patterns to extend in a first direction. Arranging the first and second PG patterns to be separated, relative to a second direction, by a PG gap having a midpoint. The second direction being substantially perpendicular to the first direction. Distributing the first routing patterns between the first and second PG patterns and substantially uniformly in the second direction with respect to the midpoint of the PG gap. Other embodiments of this aspect include corresponding computer systems, apparatus, and computer programs recorded on one or more computer storage devices, each configured to perform the actions of the methods.

Implementations may include one or more of the following features. The method further includes setting a total of the first routing patterns in the PG gap to be an odd number and locating the midpoint of the PG gap on a long axis of one of the first routing patterns. The method further includes setting a total of the first routing patterns in the PG gap to be an even number and locating the midpoint of the PG gap, relative to the second direction, in a gap between corresponding neighboring ones of the first routing patterns. The method includes, relative to the second direction, spacing the first PG pattern apart from a corresponding neighboring one of the first routing patterns, and the second PG pattern apart from a corresponding neighboring one of the first routing patterns resulting in corresponding first gaps, each first gap substantially having a first size. Spacing apart every two neighboring ones of the first routing patterns resulting in corresponding second gaps, each second gap substantially having a second size. Setting the first size to be larger than the second size. Setting the first size to be substantially the same as the second size. The method includes locating a conductive layer M(h−1) below the conductive M(h) layer. Populating the conductive layer M(h−1) with segment patterns representing corresponding conductive segments in the semiconductor device. The segment patterns of the conductive layer M(h−1) including third and fourth PG patterns. Arranging long axes of the third and fourth PG patterns to align correspondingly with the long axes of the first and second PG patterns. The method includes: making, based on the layout diagram, at least one photolithographic exposure. Fabricating, based on the layout diagram, one or more semiconductor masks. Fabricating, based on the layout diagram, at least one component in a layer of a semiconductor integrated circuit. Implementations of the described techniques may include hardware, a method or process, or computer software on a computer-accessible medium.

In some embodiments, a method of forming a semiconductor device includes forming conductive segments in a conductive layer M(h), where h is an integer and h≥ 1. The forming conductive segments including forming first and second power grid (PG) segments that extend in a first direction and are separated in a second direction by a PG gap having a midpoint. The second direction being substantially perpendicular to the first direction. Forming at least two first routing segments that extend in the first direction and overlap each other with respect to the second direction. The at least two first routing segments being distributed between the first and second PG segments and substantially uniformly in the second direction with respect to the midpoint of the PG gap. Other embodiments of this aspect include corresponding computer systems, apparatus, and computer programs recorded on one or more computer storage devices, each configured to perform the actions of the methods.

Implementations may include one or more of the following features. The method includes before the forming conductive segments in a conductive layer M(h), forming conductive segments in a conductive layer M(h−1). Forming third and fourth PG segments that extend in the first direction. Forming second routing segments. Before forming conductive segments in a conductive layer M(h−1), forming components in a device layer. The forming components in a device layer including, forming one or more transistors. Forming one or more conductive plugs connecting portions of the one or more transistors to corresponding ones of the third and fourth PG segments and the second routing segments in the conductive layer M(h−1). The forming third and fourth PG segments includes forming long axes of the third and fourth PG segments in alignment correspondingly with long axes of the first and second PG segments. The forming at least two first routing segments results in a total of the at least two first routing segments in the PG gap being an odd number. The forming at least two first routing segments results in a total of the at least two first routing segments in the PG gap being an even number. The forming at least two first routing segments results in a long axis of one of the at least two first routing segments being aligned with the midpoint of the PG gap. Relative to the second direction, the forming at least two first routing segments results in the midpoint of the PG gap being in a gap between corresponding neighboring ones of the at least two first routing segments. Relative to the second direction, the forming first and second PG segments includes: spacings between the first PG segment and a corresponding neighboring one of the at least two first routing segments, and between the second PG segment and a corresponding neighboring one of the at least two first routing segments to create corresponding first gaps, each first gap substantially having a first size. Relative to the second direction, the forming at least two first routing segments includes: preserving spacings between every two neighboring ones of the at least two first routing segments to create corresponding second gaps, each second gap substantially having a second size. The first size is larger than the second size. Relative to the second direction, the forming first and second PG segments includes: preserving spacings between the first PG segment and a corresponding neighboring one of the at least two first routing segments, and between the second PG segment and a corresponding neighboring one of the at least two first routing segments to create corresponding first gaps, each first gap substantially having a first size. Relative to the second direction, the forming at least two first routing segments includes: preserving spacings between every two neighboring ones of the at least two first routing segments to create corresponding second gaps, each second gap substantially having a second size. The first size is substantially the same as the second size. Implementations of the described techniques may include hardware, a method or process, or computer software on a computer-accessible medium.

In some embodiments, a method of forming semiconductor device include forming conductive segments in a conductive layer M(h) where h is an integer and h≥1. The forming conductive segments in the conductive layer M(h) including; forming first and second power grid (PG) segments that extend in a first direction and are separated in a second direction by a PG gap having a midpoint. The second direction being substantially perpendicular to the first direction. Forming at least two first routing segments which are conductive and extend in the first direction and overlap each other with respect to the second direction. The method further includes one of a first circumstance or a second circumstance being true. The first circumstance being the forming at least two first routing segments results in a total of the at least two first routing segments in the PG gap being an odd number, and the midpoint of the PG gap being located on a long axis of one of the at least two first routing segments. The second circumstance being the forming at least two first routing segments results in the total of the at least two first routing segments in the PG gap being an even number, and the midpoint of the PG gap being located, relative to the second direction, in a gap between corresponding neighboring ones of the at least two first routing segments. Other embodiments of this aspect include corresponding computer systems, apparatus, and computer programs recorded on one or more computer storage devices, each configured to perform the actions of the methods.

Implementations may include one or more of the following features. The method where the forming conductive segments in a conductive layer M(h) further includes distributing the at least two first routing segments between the first and second PG segments substantially uniformly in the second direction with respect to the midpoint of the PG gap. Before forming conductive segments in a conductive layer M(h). The method further comprises forming conductive segments in a conductive layer M(h−1). The forming conductive segments in a conductive layer M(h−1) including: forming third and fourth PG segments that extend in the first direction. Forming second routing segments which are conductive. Before the forming conductive segments in a conductive layer M(h−1), the method further comprises: forming components in a device layer. The forming components including forming one or more transistors. Forming one or more conductive plugs connecting portions of the one or more transistors to corresponding ones of the third and fourth PG segments and the second routing segments in the conductive layer M(h−1). The forming third and fourth PG segments includes forming long axes of the third and fourth PG segments in alignment correspondingly with long axes of the first and second PG segments. Relative to the second direction, the forming first and second PG segments includes: preserving spacings between the first PG segment and a corresponding neighboring one of the at least two first routing segments and between the second PG segment and a corresponding neighboring one of the at least two first routing segments to create corresponding first gaps, each first gap substantially having a first size. Relative to the second direction, the forming at least two first routing segments includes: preserving spacings between every two neighboring ones of the at least two first routing segments to create corresponding second gaps, each second gap substantially having a second size. One of the following is true: the first size is larger than the second size or the first size is substantially the same as the second size. Implementations of the described techniques may include hardware, a method or process, or computer software on a computer-accessible medium.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of forming a semiconductor device, the method comprising:
    forming conductive segments in a conductive layer M(h), where h is an integer and h≥1, the forming conductive segments including:
        forming first and second power grid (PG) segments that extend in a first direction and are separated in a second direction by a PG gap having a midpoint, the second direction being substantially perpendicular to the first direction; and
        forming at least two first routing segments that extend in the first direction and overlap each other with respect to the second direction, the at least two first routing segments being distributed between the first and second PG segments and substantially uniformly in the second direction with respect to the midpoint of the PG gap.

2. The method of claim 1, further comprising:
    before the forming conductive segments in a conductive layer M(h);
        forming conductive segments in a conductive layer M(h−1), including:
            forming third and fourth PG segments that extend in the first direction; and
            forming second routing segments.

3. The method of claim 2, further comprising:
    before the forming conductive segments in a conductive layer M(h−1);
        forming components in a device layer, the forming components in a device layer including:
            forming one or more transistors; and
            forming one or more conductive plugs connecting portions of the one or more transistors to corresponding ones of the third and fourth PG segments and the second routing segments in the conductive layer M(h−1).

4. The method of claim 2, wherein the forming third and fourth PG segments includes:
    forming long axes of the third and fourth PG segments in alignment correspondingly with long axes of the first and second PG segments.

5. The method of claim 1, wherein:
    the forming at least two first routing segments results in a total of the at least two first routing segments in the PG gap being an odd number.

6. The method of claim 1, wherein:
    the forming at least two first routing segments results in a total of the at least two first routing segments in the PG gap being an even number.

7. The method of claim 1, wherein:
    the forming at least two first routing segments results in a long axis of one of the at least two first routing segments being aligned with the midpoint of the PG gap; or
    relative to the second direction, the forming at least two first routing segments results in the midpoint of the PG gap being in a gap between corresponding neighboring ones of the at least two first routing segments.

8. The method of claim 1, wherein:
    relative to the second direction, the forming first and second PG segments includes:
        preserving spacings between the first PG segment and a corresponding neighboring one of the at least two first routing segments, and between the second PG segment and a corresponding neighboring one of the at least two first routing segments to create corresponding first gaps, each first gap substantially having a first size;
    relative to the second direction, the forming at least two first routing segments includes:
        preserving spacings between every two neighboring ones of the at least two first routing segments to create corresponding second gaps, each second gap substantially having a second size; and
    the first size is larger than the second size.

9. The method of claim 1, wherein:
    relative to the second direction, the forming first and second PG segments includes:
        preserving spacings between the first PG segment and a corresponding neighboring one of the at least two first routing segments, and between the second PG segment and a corresponding neighboring one of the at least two first routing segments to create corresponding first gaps, each first gap substantially having a first size;
    relative to the second direction, the forming at least two first routing segments includes:
        preserving spacings between every two neighboring ones of the at least two first routing segments to create corresponding second gaps, each second gap substantially having a second size; and the first size is substantially the same as the second size.

10. A method of forming a semiconductor device, the method comprising:

forming conductive segments in a conductive layer M(h) where h is an integer and h≥1, the forming conductive segments in the conductive layer M(h) including:

forming first and second power grid (PG) segments that extend in a first direction and are separated in a second direction by a PG gap having a midpoint, the second direction being substantially perpendicular to the first direction; and forming at least two first routing segments that extend in the first direction and overlap each other with respect to the second direction; and wherein one of a first circumstance or a second circumstance is true:

the first circumstance being that:

the forming at least two first routing segments results in a total of the at least two first routing segments in the PG gap being an odd number, and the midpoint of the PG gap being located on a long axis of one of the at least two first routing segments; or the second circumstance being that:

the forming at least two first routing segments results in the total of the at least two first routing segments in the PG gap being an even number, and the midpoint of the PG gap being located, relative to the second direction, in a gap between corresponding neighboring ones of the at least two first routing segments.

11. The method of claim 10, wherein the forming conductive segments in a conductive layer M(h) further includes:

distributing the at least two first routing segments between the first and second PG segments substantially uniformly in the second direction with respect to the midpoint of the PG gap.

12. The method of claim 10, wherein:

before the forming conductive segments in a conductive layer M(h), the method further comprises:

forming conductive segments in a conductive layer M(h−1), the forming conductive segments in a conductive layer M(h−1) including:

forming third and fourth PG segments that extend in the first direction; and forming second routing segments which are conductive.

13. The method of claim 12, wherein:

before the forming conductive segments in a conductive layer M(h−1), the method further comprises:

forming components in a device layer, the forming components including:

forming one or more transistors; and forming one or more conductive plugs connecting portions of the one or more transistors to corresponding ones of the third and fourth PG segments and the second routing segments in the conductive layer M(h−1).

14. The method of claim 13, wherein the forming third and fourth PG segments includes:

forming long axes of the third and fourth PG segments in alignment correspondingly with long axes of the first and second PG segments.

15. The method of claim 10, wherein:

relative to the second direction, the forming first and second PG segments includes:

preserving spacings between the first PG segment and a corresponding neighboring one of the at least two first routing segments, and between the second PG segment and a corresponding neighboring one of the at least two first routing segments to create corresponding first gaps, each first gap substantially having a first size; and relative to the second direction, the forming at least two first routing segments includes:

preserving spacings between every two neighboring ones of the at least two first routing segments to create corresponding second gaps, each second gap substantially having a second size; and one of the following is true:

the first size is larger than the second size; or the first size is substantially the same as the second size.

16. A method of forming a semiconductor device, the method comprising:

forming a first power grid (PG) segment extending in a first direction;

forming a second PG segment extending in the first direction, wherein the first PG segment is separated from the second PG segment in a second direction by a PG gap, the second direction is perpendicular to the first direction;

forming a plurality of routing segments in the PG gap, wherein each of the plurality of routing segments extends in the first direction, and each of the plurality of routing segments overlaps with at least one other of the plurality of routing segments in the second direction, and routing segments of the plurality of routing segments are uniformly distributed in the second direction between a midpoint of the PG gap and the first PG segment.

17. The method of claim 16, further comprising forming a plurality of second routing segments in the PG gap, wherein each of the plurality of second routing segments extends in the first direction, and each of the plurality of second routing segments overlaps with at least one other of the plurality of second routing segments in the second direction, and second routing segments of the plurality of second routing segments are uniformly distributed in the second direction between the midpoint of the PG gap and the second PG segment.

18. The method of claim 17, further comprising forming a midpoint routing segment extending in the first direction, wherein the midpoint routing segment overlaps the midpoint of the PG gap.

19. The method of claim 17, wherein forming the plurality of second routing segments comprises forming a number of the second routing segments of the plurality of second routing segments equal to a number of the routing segments of the plurality of routing segments.

20. The method of claim 16, wherein forming the plurality of routing segments comprises forming a first routing segment of the plurality of routing segments a first distance from the first PG segment in the second direction, wherein a distance between the first routing segment and an adjacent routing segment of the plurality of routing segments is the first distance.

* * * * *